(12) United States Patent
Karamooz

(10) Patent No.: US 7,326,067 B2
(45) Date of Patent: Feb. 5, 2008

(54) METHOD AND APPARATUS FOR MINIMIZING THE INSTALLATION HEIGHT OF ELECTRICAL COMPONENTS

(75) Inventor: Saeed Karamooz, Henderson, NV (US)

(73) Assignee: Vadatech Inc., Henderson, NV (US)

( * ) Notice: Subject to any disclaimer, the term of this patent is extended or adjusted under 35 U.S.C. 154(b) by 0 days.

(21) Appl. No.: 11/252,864

(22) Filed: Oct. 18, 2005

(65) Prior Publication Data

US 2007/0087586 A1   Apr. 19, 2007

(51) Int. Cl.
*H01R 12/00* (2006.01)
(52) U.S. Cl. .................................................. 439/79
(58) Field of Classification Search ............. 439/79, 439/80, 81, 66, 74
See application file for complete search history.

(56) References Cited

U.S. PATENT DOCUMENTS

| 4,457,570 | A |   | 7/1984  | Bogese, II |   |
|-----------|---|---|---------|------------|---|
| 4,497,526 | A |   | 2/1985  | Myers      |   |
| 4,647,136 | A |   | 3/1987  | Kinoshita et al. | |
| 4,698,025 | A |   | 10/1987 | Silbernagel et al. | |
| 4,764,122 | A | * | 8/1988  | Sorel et al. | 439/66 |
| 4,838,811 | A |   | 6/1989  | Nakamura et al. | |
| 4,993,956 | A | * | 2/1991  | Pickles et al. | 439/76.1 |
| 5,567,167 | A | * | 10/1996 | Hayashi | 439/75 |
| 5,702,271 | A |   | 12/1997 | Steinman | |
| 6,364,713 | B1 | * | 4/2002 | Kuo | 439/638 |
| 6,666,694 | B1 | * | 12/2003 | Daly et al. | 439/79 |
| 6,877,913 | B2 | * | 4/2005 | Goto | 385/88 |
| 2001/0027039 | A1 | * | 10/2001 | Okabe et al. | 439/79 |
| 2003/0207600 | A1 | * | 11/2003 | Ho | 439/79 |

* cited by examiner

*Primary Examiner*—Phuong Dinh
(74) *Attorney, Agent, or Firm*—Michael P. Artemis

(57) ABSTRACT

A circuit board configuration for reducing the installation height of an over-sized electrical component on a primary circuit board subject to maximum height restrictions. The invention exploits the allocated tolerance both above and below the printed circuit board. The electrical component is mounted to a daughter board, which is offset from and operatively connected to the primary circuit board. When assembled, the electrical component passes through an aperture in the primary circuit board. The offset mounting of the daughter board ensures that the component is positioned within the combined tolerance ranges as prescribed by the governing industry standards. An additional spacer between the primary and daughter boards provides additional installation height reduction.

16 Claims, 4 Drawing Sheets

METHOD AND APPARATUS FOR MINIMIZING THE INSTALLATION HEIGHT OF ELECTRICAL COMPONENTS

BACKGROUND OF THE INVENTION

1. Field of the Invention

The present invention relates to the field of electronics. More specifically, the present invention relates to a method and system for mounting oversized electrical components on a circuit board so that the assembly height is minimized and the assembly can conform to predefined physical limits.

2. Background of the Art

Common practice in the data processing, network infrastructure, and telecommunication industries is to combine computer systems into specially designed rooms known as data centers. Data Centers often contain one or more racks or chassis that are populated by various system components. These system components include among other things processor modules, power supplies, networking switches, and storage appliances such as hard drive arrays and tape backup systems. The overhead costs associated with these data centers are extremely high. The data centers often require highly trained personnel, power conditioners, and special security measures, environmental controls such as air conditioning and dehumidifiers, and high bandwidth internetworking connections. Therefore, there are financial incentives to increasing the total number of system components that can be installed into any given data center. The industry addresses this condition by maximizing the density of electronic equipment that can fit into each square foot of a data center.

The electronic equipment in a data center is arranged with each rack or chassis containing individual subsystems. The subsystems are commonly housed in a carrier. The carriers are installed into a chassis and mechanically and electrically connected to a backplane. A chassis may contain one to several carriers. Additionally, the carriers may contain an individual board that performs a specific function such as video input/output, Ethernet connection, fiber-optic communication and many other system functions. Within a carrier there are designated several module bays that are capable of housing an electronics board such as an Advanced Mezzanine Card (AMC). The bays are allocated a specific amount of carrier space as allowed by the industrial standards discussed below. A board that occupies one bay is commonly referred to as a half-height board. When a board contains components having dimensions which cannot be accommodated by a single module bay, the board may occupy two adjacent bays; this is referred to as a full-height board. The industry strives to use half-height boards when ever possible in order to optimize the electronic density of the data center.

Industry groups such as the Institute of Electrical and Electronics Engineers (IEEE), VMEBus International Trade Association (VITA), and the PCI Industrial Computer Manufacturing Group (PICMG) have defined various standards that facilitate interoperability between components from different manufacturers. These standards, IEEE 1014, and ANSI/VITA 1-1994 (R2002), and PICMG AMC.0 describe the electrical interface and mechanical form a subsystem must conform to for proper functionality with other subsystems that follow the same standard.

Typically, these standards describe a maximum height an electrical component is permitted to protrude from each side of a printed circuit board (PCB). For example, the PICMG AMC.0 specification defines the mechanical form factor for a half-height Advanced Mezzanine Card (AMC). This specification limits the maximum amount that an electrical component can protrude above Component Side 1 on an AMC to 8.18 mm and to 3.4 mm for the reverse Component Side 2. Some commonly available components such as most common modular jack connectors used in twisted pair Ethernet networking are too tall to use given this height limit and still conform to the specification for a half-height board. This narrows the pool of available components that can be mounted on a PCB and still meet the specification. The current solutions for this situation are to use two adjacent bays for a single AMC or deviate from common electrical components and use custom and proprietary designed electronic components. Both of these current solutions are very expensive and not favored in the industry. First, using two bays for a single board does not optimize the density of electronic devices in each square foot of a data center. Secondly, designing and manufacturing custom components is both expensive and time consuming; it is preferred to maximize the use of common or off-the-shelf components whenever possible.

One teaching which addresses the need for compact electrical component mounting is found in U.S. Pat. No. 5,702,271 the disclosure of which is hereby incorporated by reference. U.S. Pat. No. 5,702,271 teaches the use of a custom-designed modular jack in combination with a circuit board having an aperture which receives a lower portion of the jack housing, when the jack is mounted on the component surface of the circuit board. This approach enables the over-sized jack to be used without exceeding the height standard for the circuit board components. This approach, while useful, provides only a small amount of additional mounting height space and requires a custom component.

Efforts to provide a generally applicable mounting arrangement for standard components having an over-sized height dimension which exceeds the appropriate height standard have not met with success to date.

SUMMARY OF THE INVENTION

The present invention is a method and apparatus for enabling standard components having an over-sized height dimension to be combined with a circuit board without exceeding the height standard of a half-height board.

From a broadest apparatus aspect, the invention comprises the combination of a primary circuit board and a daughter board on which one or more components are mounted.

The primary circuit board has a thickness dimension, a first surface with a plurality of electrical contact sites for providing operative electrical connections, and a second surface. The primary circuit board further includes an aperture for providing access space for an electrical component mounted on the daughter board. In the preferred embodiment, the aperture is a u-shaped opening located in a forward portion of the primary circuit board.

The daughter board has a first surface with a plurality of electrical contact sites for providing operative electrical connections to the contact sites of the primary circuit board, the daughter board having at least one electrical component operatively attached thereon. The daughter board is operatively fastened to the primary circuit board with the first surface thereof facing the first surface of the primary circuit board and the electrical contact sites thereof coupled to the electrical contact sites of the primary circuit board to provide ohmic coupling therebetween. With the two boards assembled together, the electrical component passes through the aperture on said primary circuit board and the height of the electrical component above the second surface of the primary circuit board is reduced by the thickness dimension of the primary circuit board.

The invention preferably further includes a spacer member having an additional thickness dimension and positioned between the first surface of the primary circuit board and the first surface of the daughter board. The spacer member has a plurality of electrical contacts corresponding to the electrical contact sites of the primary circuit board and the daughter board which provide ohmic contact therebetween. With the spacer member inserted between the primary and daughter boards, the height of the electrical component above the second surface of the primary circuit board is additionally reduced by the amount of the additional thickness dimension.

The electrical contact sites on the primary circuit board may be individual contacts; and the electrical contact sites on the daughter board may be matching press-fit contacts. Alternatively, the electrical contact sites on the primary circuit board may be through-hole contacts, and the electrical contact sites on the daughter board may be contact pins.

From a broadest process aspect, the invention comprises a method of minimizing the installation height of an electrical component on a primary circuit board, the method comprising the steps of:
  (a) providing a primary circuit board having a thickness dimension, a first surface with a plurality of electrical contact sites for providing operative electrical connections, a second surface, and an aperture for providing access space for an electrical component;
  (b) providing a daughter board having a first surface with a plurality of electrical contact sites and at least one electrical component operatively attached thereon; and
  (c) attaching the daughter board to the primary circuit board with the first surface of the daughter board facing the first surface of the primary circuit board with the electrical contact sites of both intercoupled to provide ohmic coupling therebetween, and the electrical component passing through the aperture on the primary circuit board whereby the height of the electrical component above the second surface of the primary circuit board is reduced by the thickness of the primary circuit board.

The step (c) of attaching preferably includes the steps of (i) providing a spacer member having an additional thickness dimension and a plurality of electrical contacts corresponding to the electrical contact sites of the primary circuit board and the daughter board, and (ii) positioning the spacer member between the primary circuit board and the daughter board with the plurality of electrical contacts in ohmic contact between the electrical contact sites of the primary circuit board and the daughter board, whereby the height of the electrical component above the second surface of the primary circuit board is further reduced by the additional thickness of the spacer member.

For the embodiment in which the electrical contact sites on the primary circuit board are individual contacts and the electrical contact sites on the daughter board are press-fit contacts; and the step (c) of attaching includes the step of aligning the individual contacts with the press-fit contacts.

For the embodiment in which the electrical contact sites on the primary circuit board are through-hole contacts, and the electrical contact sites on the daughter board are contact pins; and the step (c) of attaching includes the step of inserting the contact pins into the through-hole contacts.

The invention enables a wide variety of standard components having a height dimension, which exceeds the standard for half-height circuit boards to nonetheless be used with circuit boards in compliance with the height standards. This reduces the cost of fabricating circuit boards (by eliminating the need for custom components) while increasing the use of half-height circuit boards in systems.

For a fuller understanding of the nature and advantages of the present invention, reference should be made to the ensuing detailed description and claims, taken in conjunction with the accompanying drawings.

DETAILED DESCRIPTION OF THE INVENTION

Figure 1:
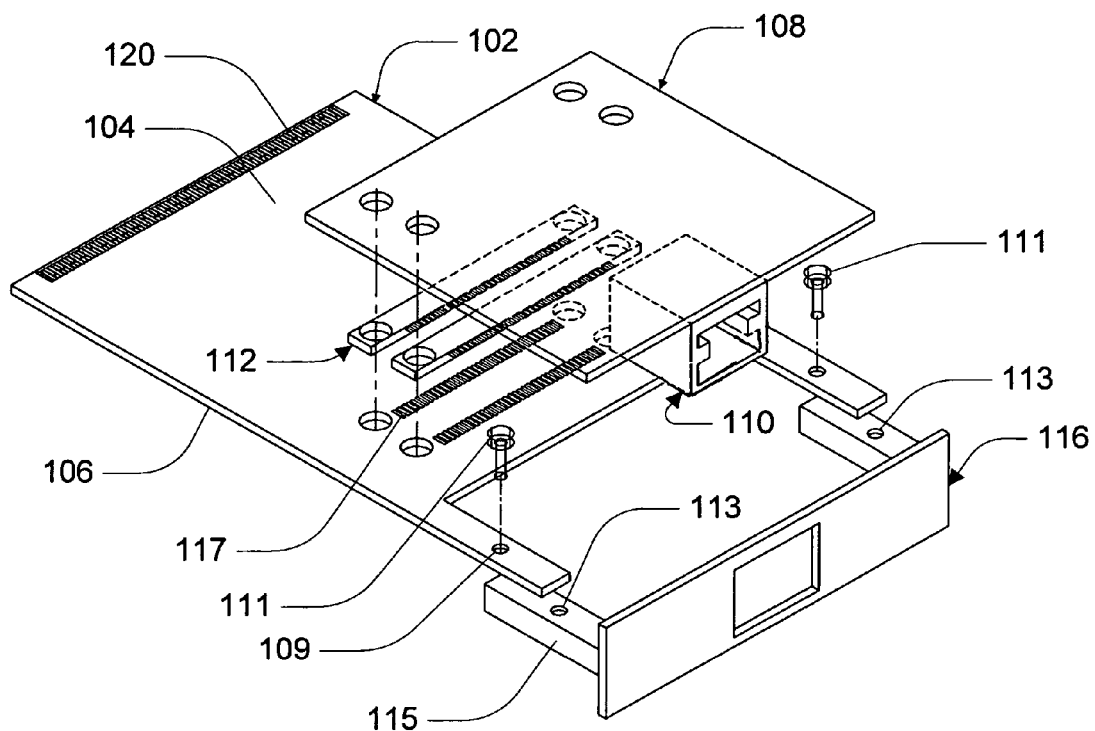
FIG. 1 is an exploded isometric view of the invention including a faceplate as viewed from the bottom.

Turning now to the drawings, FIG. 1 illustrates a primary circuit board 102 having an obverse component side 106 for mounting electronic components and a reverse component side 104. A daughter board 108 is operatively connected to reverse side 104 of primary circuit board 102 by mechanical and electrical contacts of a pair of press-fit contacts 112. An electronic component 110 is operatively connected to the daughter board 108 and passes through a aperture 114 provided in primary circuit board 102. Primary circuit board 102 has electrical contacts 120 along the rear edge thereof for facilitating the connection of circuitry between primary circuit board 102 and a carrier (not shown). A plurality of electrical contacts 117 provides the ohmic connections between circuitry located on primary circuit board 102 and circuitry located on daughter board 108 via press-fit contacts 112. Primary circuit board 102 is secured into the carrier by a detent mechanism (not shown) on a faceplate 116.

Figure 2:
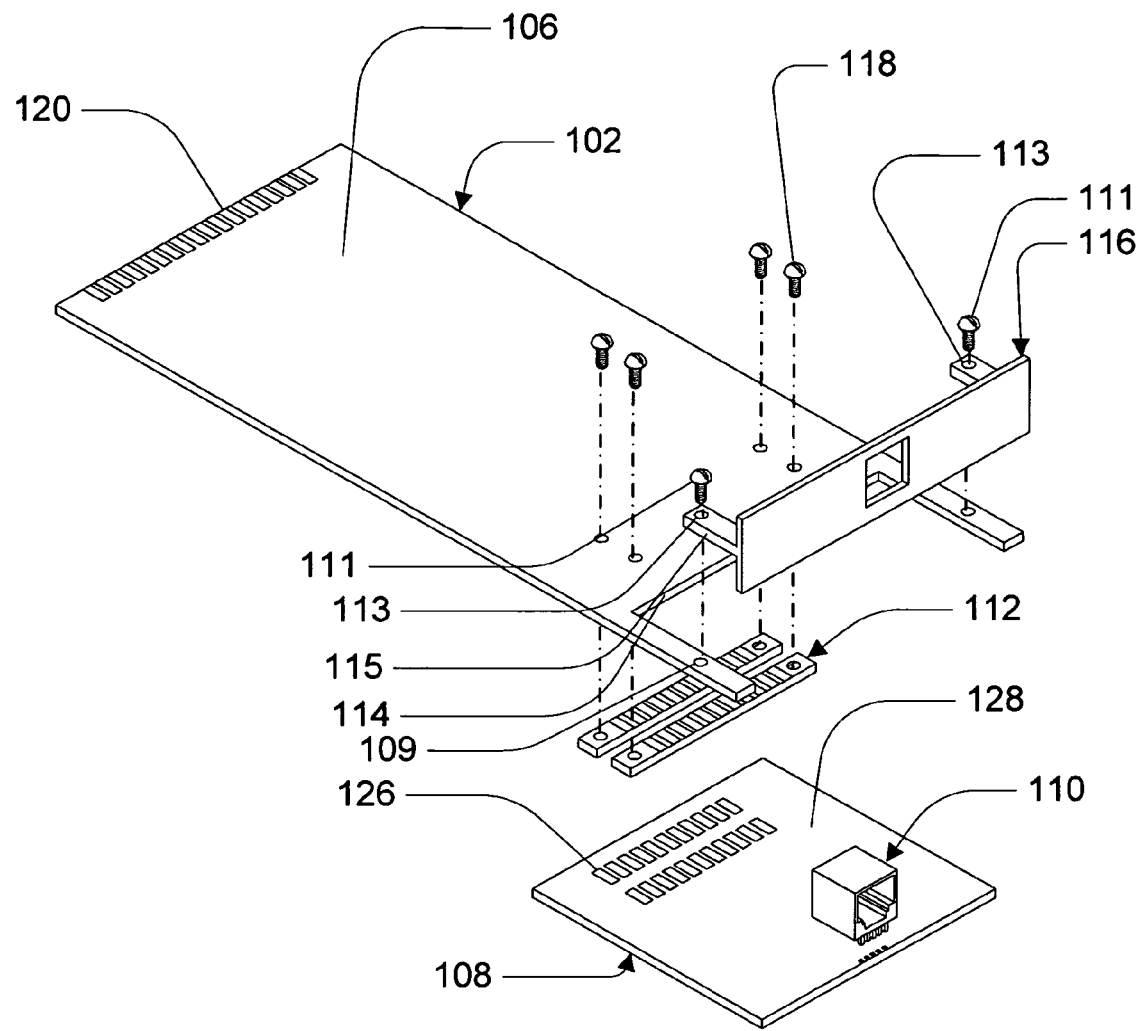
FIG. 2 is an exploded isometric view of the invention as viewed from the top.

FIG. 2 illustrates an exploded isometric view of daughter board 108 and primary circuit board 102. A plurality of contacts on daughter board 108 provides the contacts for circuitry between primary circuit board 102 and daughter board 108 by way of press-fit contacts 112. The assembly of the primary circuit board 102 and daughter board 108 is secured by fastening means such as a screws 118, which threadably engages press-fit contacts 112. However, the two boards may be secured by other known means such as rivets, adhesives, epoxies, solder or other known ways that provide a secure mechanical and electrical connection between the two boards. Each press-fit contact 112 is an ultra-low profile electronic connector that contains a plurality of contact sites and is permanently attached to daughter board 108. One such connector is available from Samtec Corporation as Samtec® part number SEI-103-02-F-S-E and facilitates the low profile mounting of the primary circuit board 102 and daughter board 108.

Figure 3:
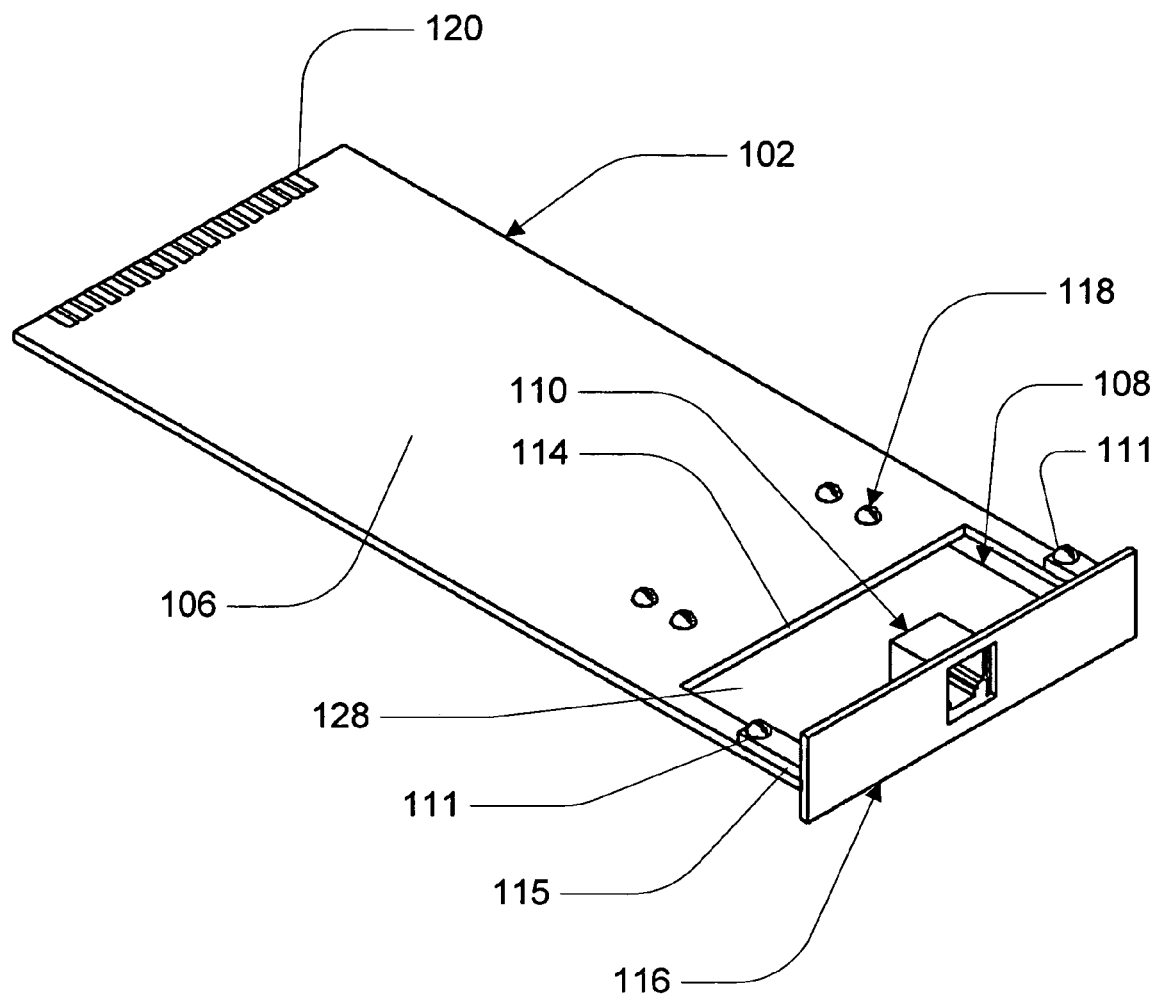
FIG. 3 is an isometric view of the invention as assembled as viewed from the top.

The two boards are assembled as shown in FIG. 3. This figure illustrates the electronic component 110 passing through the primary circuit board aperture 114. The electronic component 110 may be a common Ethernet modular jack, fiber optic connector, multimedia connector, firewire, Universal Serial Buss (USB) connector, liquid crystal display (LCD) module, digital processor, audio/video connector, transistor, capacitor, resistor or other electronic component.

Figure 4:
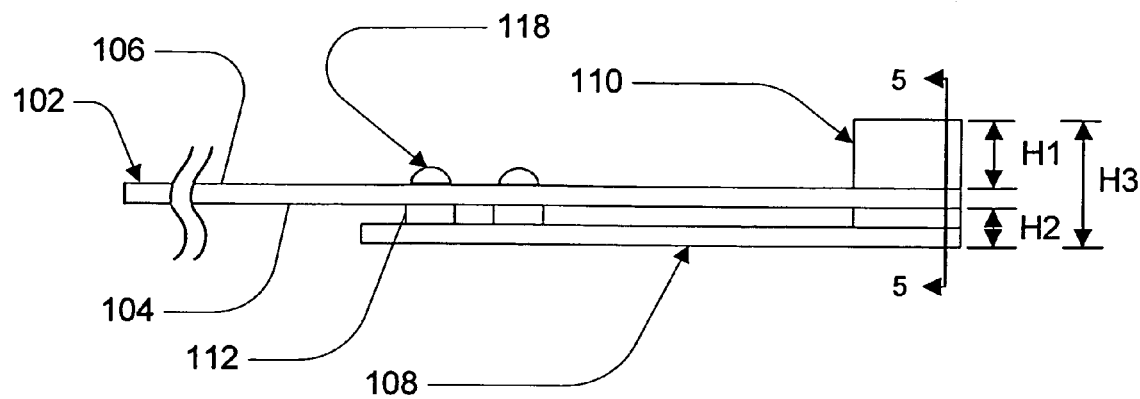
FIG. 4 is an elevation side view of the assembled invention of FIG. 3.
Figure 5:
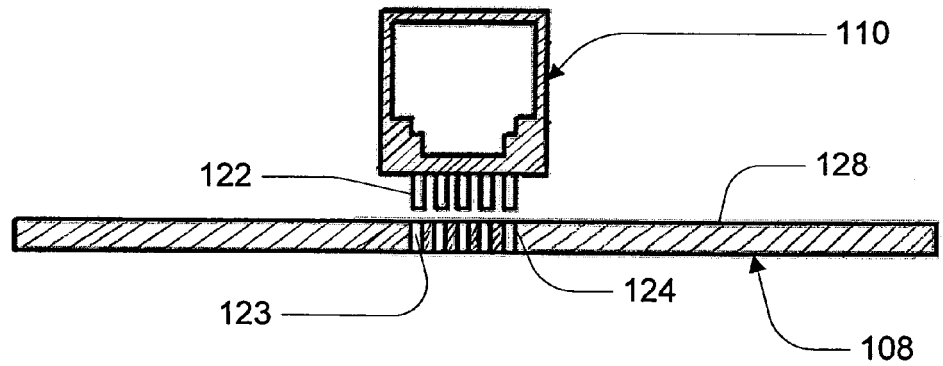
FIG. 5 is an exploded elevation cross-section view of an electrical component mounted to a daughter board.

As best seen in FIG. 4, in an assembled unit an over-sized component 110 can be used without violating the constraints imposed by the maximum height H3 standards for half-height circuit boards. In this Fig., H1 and H2 represent the industry height standards. Thus, H1 is the maximum height above the obverse surface 106 of circuit board 102 to which a component 110 may extend, and H2 is the maximum height below the reverse surface 104 of circuit board 102 to which any element may extend. Component 110 is mounted on the obverse surface 128 of daughter board 108 and extends upwardly through aperture 114 provided in circuit board 102. Daughter board 108 is secured to the reverse surface 104 of circuit board 102 and is spaced therefrom by press fit contacts 112. This arrangement allows a component 110 having a height dimension greater than H1 to be incorporated into the assembled unit without exceeding the limit standard of H1. The additional height dimension of component 110 which can be accommodated is a function of the combined thicknesses of circuit board 102, daughter board 108, and press fit contacts 112. So long as the height dimension of component 110 does not exceed the combined thicknesses of circuit board 102 and press fit contacts 112, less the thickness of daughter board 108, component 110 can comply with the industry height standards imposed. FIG. 5 shows an electrical component 110 mounted to the obverse surface 128 of a daughter board 108. As shown in this figure, electrical component 110 is connected to the daughter board by a plurality of electrical contact pins 122. These contact pins 122 are received through apertures 123 and operatively connected to the daughter board circuitry by contact sites 124.

In the specific embodiment illustrated, the electronic component 110 installed on daughter board 108 is a modular jack connector such as an Ethernet jack. The modular jack connector is operatively connected to daughter board 108 and circuitry (not shown) contained therein. The daughter board 108 is then attached to the primary circuit board 102 by establishing an electro/mechanical connection through the press-fit contacts 112. The number of press-fit contacts 112 is dependant on the particular functionality of the daughter board 108. There may be one or a plurality of press-fit connectors 112 required. The boards 102, 108 are secured by fasteners 118 and additional mechanical integrity is afforded by the attachment of a faceplate 116 to the forward portion of board 102 through apertures 109 by fasteners 111 which are threadably received in threaded apertures 113 formed in a pair of support arms 115.

The invention provides several advantages not found in known Advanced Mezzanine Card (AMC) electronic component assemblies. For example, the invention enables the use of standard electronic components that ordinarily would not comply with a half-height form factor without violating the industry height standards. Consequently, common off-the-shelf electronic components may be implemented more frequently without having to use a full-height board. This expands the possibility of the use of half-height form factor boards, which substantially increases the electronic component density in a data center and offers significant financial benefits for the data center operator The invention also reduces manufacturing costs by avoiding the need to use proprietary or custom designed components to fit a half-height form factor.

It should be noted that aperture 114 may take other forms than that illustrated in the Figs. and described above. If deemed desirable, aperture 114 may be bounded on all four sides by primary circuit board 102. In addition, the location of aperture need not be limited to the forward position shown, but may be selected to conform with the physical parameters of circuit board 102. Thus, for example, aperture 114 may be an open aperture positioned on one of the side edges of board 102 or a bounded aperture positioned within the perimeter of the board. In general, the location of aperture 114 is selected to conform with the positioning of the circuit components on board 102, as well as the conductive patterns designed to interconnect these components.

Although the above provides a full and complete disclosure of the preferred embodiment of the invention, various modifications, alternate constructions and equivalents will occur to those skilled in the art. For example, although the invention has been described with reference to a press-fit contacts, other types of connections between the primary circuit board and daughter board can be utilized as desired. Moreover, different types of electrical components can be mounted to the daughter board to practice the invention. Additionally, the daughter board may be either removable or may be permanently attached to the primary circuit board. Therefore, the above should not be construed as limiting the invention, which is defined by the claims.

What is claimed is:

1. In combination:
    a primary circuit board comprising a thickness dimension, a first surface with a plurality of electrical contact sites for providing operative electrical connections, and a second surface, said primary circuit board substantially configured as an advanced mezzanine card, said primary circuit board further comprising an aperture at a first location for providing access space for an electrical component to pass there through; and
    a daughter board comprising a first surface with a plurality of electrical contact sites for providing operative electrical connections to said contact sites of said primary circuit board, said daughter board comprising having at least one electrical component operatively attached thereon at a second location and facing away from said first surface thereof, said daughter board being operatively fastened to said primary circuit board with said first surface thereof facing said first surface of said primary circuit board and said electrical contact sites thereof coupled to said electrical contact sites of said primary circuit board to provide ohmic coupling there between, said first and second locations being sufficiently aligned that said electrical component passes through said aperture on said primary circuit board and a faceplate attached to the primary circuit board and having an opening exposing the electrical component,
    whereby the height of said electrical component above said second surface of said primary circuit board is reduced by said thickness dimension.

2. The combination of claim 1 further including a spacer member positioned between said first surface of said primary circuit board and said first surface of said daughter board, said spacer member having a plurality of electrical contacts corresponding to said electrical contact sites of said primary circuit board and said daughter board and providing ohmic contact therebetween, said spacer member having an additional thickness dimension,
    whereby the height of said electrical component above said second surface of said primary circuit board is additionally reduced by said additional thickness dimension.

3. The combination of claim 1 wherein said primary circuit board has a forward portion; and wherein said aperture is formed in said forward portion.

4. The combination of claim 3 wherein said aperture is a u-shaped opening in said forward portion of said primary circuit board.

5. The combination of claim 1 wherein said electrical contact sites on said primary circuit board are individual contacts, and wherein said electrical contact sites on said daughter board are press-fit contacts.

6. The combination of claim 1 wherein said electrical contact sites on said primary circuit board are through-hole contacts, and wherein said electrical contact sites on said daughter board are contact pins.

7. For use with a daughter board comprising a surface with a plurality of electrical contact sites for providing operative electrical connections and at least one electrical component operatively attached thereon in a predetermined region of the daughter board and facing away from said surface;
   a primary circuit board comprising a substrate having a thickness dimension, a first surface with a plurality of electrical contact sites positioned at locations for providing operative electrical connections with the electrical contact sites of the daughter board, said primary circuit board substantially configured as an advanced mezzanine card, said primary circuit board having fastening means for enabling said daughter board to be securely retained thereto, and a second surface, said primary circuit board further comprising an aperture for providing access space for the electrical component mounted on the surface of the daughter board to pass there through and extend beyond said second surface, said aperture being located in a position ensuring substantial alignment with said predetermined region when the primary circuit board and the daughter board are attached, whereby the height of the electrical component mounted on the daughter board above said second surface of said primary circuit board is reduced by said thickness dimension when the primary circuit board and the daughter board are attached and a faceplate attached to the primary circuit board and having an opening exposing the electrical component.

8. The invention of claim 7 wherein said primary circuit board has a forward portion; and wherein said aperture is formed in said forward position.

9. The invention of claim 8 wherein said aperture us a u-shaped opening in said forwasrd portion of said primary circuit board.

10. The invention of claim 7 wherein said electrical contact sites on said primary circuit board are individual contacts.

11. The invention of claim 7 wherein said electrical contact sites on said primary circuit board are through-hole contacts.

12. In combination:
   a primary circuit board comprising a thickness dimension, a first surface with a plurality of electrical contact sites for providing operative electrical connections, and a second surface, said primary circuit board substantially configured as an advanced mezzanine card said primary circuit board further comprising an aperture at a first location for providing access space for an electrical component to pass there through;
   a daughter board comprising a first surface with a plurality of electrical contact sites for providing operative electrical connections to said contact sites of said primary circuit board, said daughter board comprising at least one electrical component operatively attached thereon at a second location and facing away from said first surface thereof, said daughter board being operatively fastened to said primary circuit board with said first surface thereof facing said first surface of said primary circuit board and said electrical contact sites thereof coupled to said electrical contact sites of said primary circuit board to provide ohmic coupling there between, said first and second locations being sufficiently aligned that said electrical component passes through said aperture on said primary circuit board; and
   a spacer member positioned between said first surface of said primary circuit board and said first surface of said daughter board, said spacer member having a plurality of electrical contacts corresponding to said electrical contact sites of said primary circuit board and said daughter board and providing ohmic contact there between, said spacer member having an additional thickness dimension;
   whereby the height of said electrical component above said second surface of said primary circuit board is reduced by said thickness dimension and said additional thickness and a faceplate attached to the primary circuit board and having an opening exposing the electrical component.

13. The combination of claim 12 wherein said primary circuit board has a forward portion; and wherein said aperture is formed in said forward portion.

14. The combination of claim 13 wherein said aperture is a u-shaped opening in said forward portion of said primary circuit board.

15. The combination of claim 12 wherein said electrical contact sites on said primary circuit board are individual contacts, and wherein said electrical contact sites on said daughter board are press-fit contacts.

16. The combination of claim 12 wherein said electrical contact sites on said primary circuit board are through-hole contacts, and wherein said electrical contact sites on said daughter board are contact pins.

* * * * *